United States Patent [19]
Deeney

[11] Patent Number: 5,783,862
[45] Date of Patent: Jul. 21, 1998

[54] ELECTRICALLY CONDUCTIVE THERMAL INTERFACE

[75] Inventor: Jeffrey L. Deeney, Ft. Collins, Colo.

[73] Assignee: Hewlett-Packard Co., Palo Alto, Calif.

[21] Appl. No.: 938,282

[22] Filed: Sep. 26, 1997

Related U.S. Application Data

[63] Continuation of Ser. No. 720,262, Sep. 26, 1996, abandoned, which is a continuation of Ser. No. 514,349, Aug. 4, 1995, abandoned, which is a continuation of Ser. No. 201,131, Feb. 24, 1994, abandoned, which is a continuation of Ser. No. 855,370, Mar. 20, 1992, abandoned.

[51] Int. Cl.$^6$ .................................................. H01L 23/34
[52] U.S. Cl. .................... 257/714; 257/719; 257/720; 257/746; 257/747; 361/708; 361/712; 165/104.17; 165/185
[58] Field of Search ..................... 165/104.17, 185; 257/714, 719, 720, 746, 747; 361/705, 707, 708, 712

[56] References Cited

U.S. PATENT DOCUMENTS

| | | | |
|---|---|---|---|
| 3,226,608 | 12/1965 | Coffin, Jr. | 257/746 |
| 3,399,332 | 8/1968 | Savolainen | 257/746 |
| 3,600,787 | 8/1971 | Lindsay | 29/254.1 |
| 3,694,699 | 9/1972 | Snyder et al. | 317/100 |
| 3,780,356 | 12/1973 | Laing | 165/185 |
| 3,971,435 | 7/1976 | Peck | 257/715 |
| 4,000,509 | 12/1976 | Jarvela | 257/719 |
| 4,057,101 | 11/1977 | Ruka et al. | 165/185 |
| 4,130,233 | 12/1978 | Chisholm | 228/126 |
| 4,295,151 | 10/1981 | Nyul et al. | 257/746 |
| 4,299,715 | 11/1981 | Whitfield et al. | 165/185 |
| 4,384,610 | 5/1983 | Cook et al. | 165/80 A |
| 4,446,916 | 5/1984 | Hayes | 165/104.17 |
| 4,482,912 | 11/1984 | Chiba | 257/746 |
| 4,612,978 | 9/1986 | Cutchaw | 257/714 |
| 4,639,829 | 1/1987 | Ostergren et al. | 257/719 |
| 4,654,754 | 3/1987 | Daszkowski | 361/388 |
| 4,915,167 | 4/1990 | Altoz | 165/185 |
| 5,180,001 | 1/1993 | Okada et al. | 165/185 |
| 5,323,294 | 6/1994 | Layton et al. | 257/714 |
| 5,325,913 | 7/1994 | Altoz | 165/32 |
| 5,402,004 | 3/1995 | Ozmat | 257/718 |
| 5,404,272 | 4/1995 | Lebailly et al. | 257/714 |
| 5,459,352 | 10/1995 | Layton et al. | 257/718 |
| 5,561,590 | 10/1996 | Norell et al. | 257/714 |
| 5,572,404 | 11/1996 | Layton et al. | 257/714 |

OTHER PUBLICATIONS

Hwang & Oktay, Thermal Interface Conduction Pad, IBM Tech. Dis. Bull. vol. 21 No. 10 Mar. 1979 p. 4028.

*Primary Examiner*—David Ostrowsi
*Attorney, Agent, or Firm*—Alexander J. Neudeck

[57] ABSTRACT

A thermal interface 26 between a heat source (e.g., an IC die) 24 and a heat sink 28 comprises a metallic mesh (26a) filled with a thermally conductive semi-liquid substance (26b). The thermally conductive semi-liquid substance may comprise, e.g., silicone grease or paraffin. The wire mesh may comprise silver, copper and/or gold cloth.

22 Claims, 1 Drawing Sheet

ELECTRICALLY CONDUCTIVE THERMAL INTERFACE

CROSS REFERENCE TO RELATED APPLICATION(S)

This application is a continuation of application Ser. No. 08/720,262 filed on Sep. 26, 1996, now abandoned; which is a continuation of application Ser. No. 08/514,349 filed on Aug. 4, 1995, now abandoned; which is a continuation of application Ser. No. 08/201,131 filed on Feb. 24, 1994, now abandoned; which is a continuation of application Ser. No. 07/855,370 filed on Mar. 20, 1992, now abandoned.

FIELD OF THE INVENTION

The present invention generally relates to thermal interface materials, and more particularly relates to an electrically conductive thermal interface for coupling an integrated circuit (IC) die to a heat sink.

BACKGROUND OF THE INVENTION

A preferred application of the present invention is as an interface between a high-density integrated circuit die and a metallic heat sink for maintaining the temperature of the IC die below a prescribed maximum temperature. Such an interface is also required in many other applications, for example, between a power transistor and a heat sink or between any other high power device packaged in a metallic case and a heat sink.

As mentioned above, the object of heat sinking is to keep the operating temperature of a relevant junction of the IC or other device below some maximum specified temperature. For silicon transistors in metal packages, for example, the maximum junction temperature of the IC is typically 200° C., whereas for transistors in plastic packages it is usually 150° C. The problem of designing an effective heat sinking system can be stated as follows: Given the maximum power the device will dissipate in a given circuit, one must calculate the relevant junction temperature, allowing for the effects of thermal conductivity in the IC, interface, heat sink, etc., and the maximum ambient temperature in which the circuit is expected to operate. A heat sink large enough to keep the junction temperature well below the maximum specified operating temperature must then be chosen. To determine the overall thermal performance of a packaging system, the designer must take into account the thermal resistance ($\theta_c$), of each component in the thermal path. The thermal conductivity ($K_c$), defined in units of Watts per meter per degree Kelvin, is used to calculate the thermal resistance of each element.

In many instances the heat sink is required to be electrically insulated from the integrated circuit die, however there are also situations in which the heat sink serves as a ground or source of back gate voltage, e.g., in circuits for NMOS devices that require a fixed voltage on the silicon. In cases where the heat sink serves as a source of ground or back gate voltage, the interface between the heat sink and the IC die must be electrically conductive as well as thermally conductive.

FIG. 1 depicts an example of an IC assembly that employs an electrically and thermally conductive interface between a heat sink and an IC die. The assembly of FIG. 1 comprises an extruded aluminum heat sink 10, an epoxy preform 12, a heat spreader 14, a support ring 16, an encapsulated IC die 18, a tape-automated bonding (TAB) circuit 20 and a PC board 22. An extruded aluminum heat sink is employed in the assembly of FIG. 1 because of its ability to efficiently dissipate large amounts of thermal energy. However, because of the high coefficient of thermal expansion (CTE) and difficulty of making reliable electrical connections, the die 18 is not directly attached to the aluminum heat sink 10. An intermediate heat spreader 14 is placed between the die 18 and the heat sink 10. A b-stage epoxy preform 12 is employed to attach the heat sink 10 to the heat spreader 14, and an electrically conductive silver-filled thermoset epoxy (not shown) is used to attach the die 18 to the heat spreader 14. When the assembly is bolted together, knurled fasteners, pressed into two corners of the heat spreader, provide back gate electrical connections to plated pads on the backside of the PC board 22. The interface used to attach the die to the heat spreader (silver-filled thermoset epoxy in the assembly of FIG. 1) is required to have high thermal and electrical conductivity, high resistance to moisture, and a degree of mechanical compliance.

A problem with known epoxy-based interface materials is that they prevent the IC die from being detached from the heat sink after the epoxy has set. This characteristic is a particular disadvantage in the design and development stage, during which the assembly is typically assembled and disassembled many times. Another problem with rigid epoxy-based interface materials is that the difference in the CTE of the heat sink and the CTE of the substrate can cause a large stress to be placed on the IC die when the heat sink and substrate expand or contract. Accordingly, a primary goal of the present invention is to provide an electrically conductive thermal interface material that possesses high thermal and electrical conductivity. Further goals of the invention are to provide an interface that allows the assembly to be assembled and disassembled many times without damaging the interface or other components of the assembly, and that minimizes the stress placed on the die as a result of thermal expansion of the heat sink and substrate.

SUMMARY OF THE INVENTION

The present invention provides an electrically conductive thermal interface that achieves high thermal and electrical conductivity by means of a pressure connection that can be assembled and disassembled many times. An electrically conductive thermal interface in accordance with the present invention comprises a metallic mesh filled with a thermally conductive semi-liquid substance that exhibits viscous flow upon heating. The thermally conductive semi-liquid substance may comprise, e.g., silicone grease, paraffin or mineral-filled paraffin (e.g., paraffin filled with alumina or aluminum nitride). The wire mesh may be made of any one of a variety of metals, including silver, copper or gold. (Relevant considerations are thermal conductivity, ductility and cost.) In addition, there may also be a protective plating on the wire mesh to enhance the electrical performance of the interface.

Examples of the invention have exhibited thermal conductivities comparable to that of silver-filled epoxy ($K_c$=1.9 W/m-°K.). For example, with a contact pressure of between 15 and 100 pounds per square inch, $K_c$ was found to be 1.5 W/m-°K. for a bare mesh, 2.3 W/m-°K. for a paraffin-filled mesh and 2.7 W/m-°K. for a mesh filled with thermal grease. These conductivities will of course vary in accordance with the pressure used to push the heat source toward the heat sink (i.e., depending upon how tightly the fibers of the wire mesh are packed).

Prior art thermal interfaces do not supply both the good thermal and electrical conductivity required for some applications. By using a metal mesh, good thermal conductivity is obtained when the fibers are pressed together to effectively form hundreds of thermal "vias". Reliable electrical connections are obtained at the high pressure areas where the loops of the mesh contact the components. Unlike metal-filled epoxies, the assembly can be assembled and disassembled many times without damaging the IC. The electrical conductivity of the interface is similarly a function of the pressure applied to the interface.

In addition, the present invention provides a compliant, stress-free interface, which allows the heat sink to be directly attached (e.g., without a heat spreader) to a wide variety of substrates, such as copper and aluminum. (In choosing a substrate, the electrical contact properties of the surface must be considered; for example, aluminum forms hard, non-conductive oxides.) Other features of the invention are described below.

DETAILED DESCRIPTION OF PREFERRED EMBODIMENTS

Figure 1:
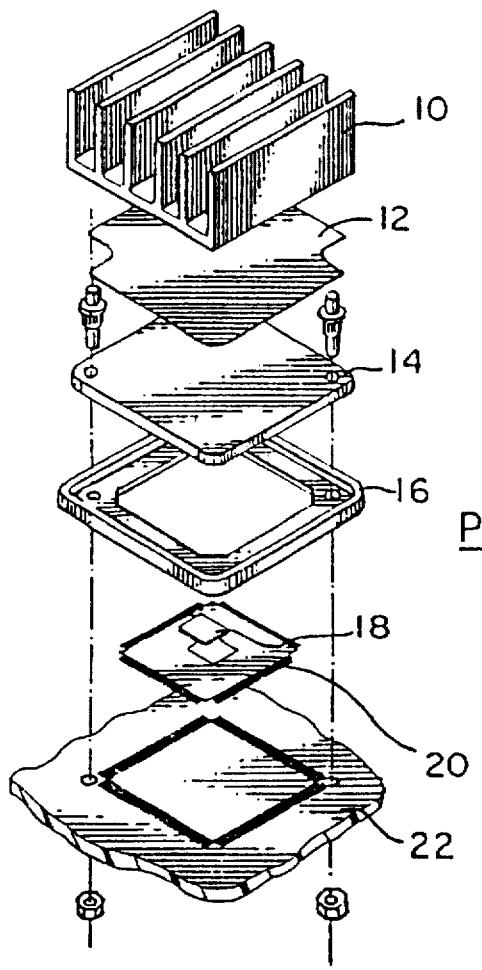
FIG. 1 depicts an exploded assembly view of a prior art integrated circuit assembly.
Figure 2:
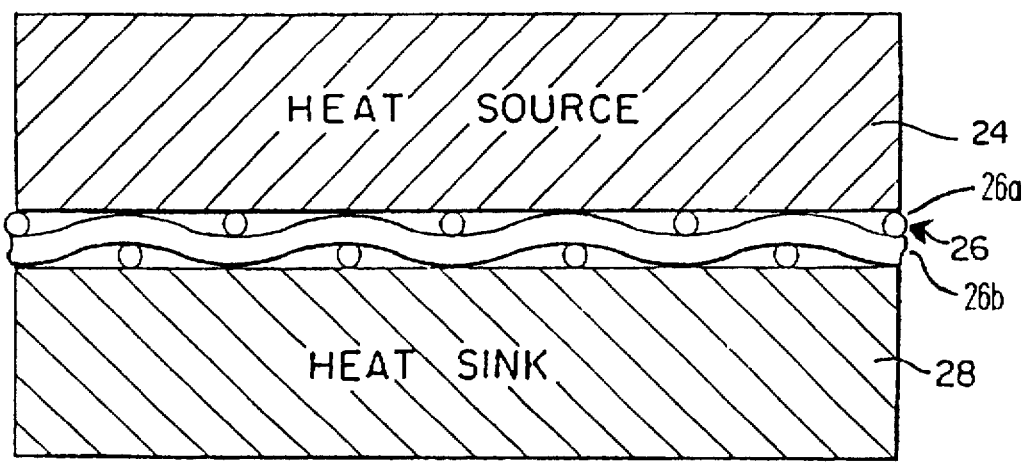
FIG. 2 depicts a cross-sectional view of an apparatus comprising a heat source coupled to a heat sink by an electrically conductive thermal interface in accordance with the present invention.

FIG. 2 schematically depicts a preferred application of a thermal interface in accordance with the present invention. This application includes a heat source (e.g., an IC die) 24, an interface 26 and a heat sink 28. The interface 26 comprises a metallic mesh, or clothe, 26a filled with a thermally conductive semi-liquid substance 26b (i.e., the semi-liquid substance 26b fills, at least partially, the interstices between the respective wires of the mesh 26a). The thermally conductive semi-liquid substance may comprise, e.g., silicone grease, paraffin or mineral-filled paraffin.

The wire mesh may be made of any one of a variety of metals, including (but not limited to) silver, copper and/or gold. In addition, the wire mesh may advantageously be coated with a protective plating (not shown) to enhance electrical performance. Plating with 30–50 microinches of nickel followed by a gold flash (e.g., 5–10 microinches) will improve the electrical conductivity of the interface; however, the hardness of nickel may decrease the ductility of the mesh and thus reduce the thermal conductivity. (The ductility will determine the amount of surface area of the mesh in contact with the heat source and heat sink, an important factor in the thermal resistance of the mesh.) It should also be noted that the thinner the mesh and the denser the wire pattern, the lower the thermal resistance. A 180 mesh screen with 0.0023-inch diameter wires has been successfully employed by the present inventor.

In using the present invention, the flatness of the substrate or other component to which the interface is coupled is an important consideration; ground and lapped surface finishes will provide the best results.

Although a preferred application of the present invention is as an interface between an IC die and a heat sink, the true scope of the invention as described in the following claims is not limited to this particular application. For example, the present invention may be used in any assembly where there is a need for a material that is both electrically and thermally conductive. In addition, the present invention is not limited to the materials specified above (silicone grease, paraffin, silver, copper, gold, etc.), since these materials may be replaced with materials that function equivalently in the context of the invention.

What is claimed is:

1. A thermal and electrical interface for conducting heat and electricity which may be non-destructively assembled and disassembled, comprising:

a first member;

a second member; and a woven mesh screen, said woven mesh screen being comprised of metal wires, said metal wires being woven to form interstitial voids between said metal wires, said interstitial voids being filled with a non-metallic thermally conductive wetting compound which is not permanently solid, and said woven mesh screen being compressed between said first member and said second member, said metallic mesh screen also contacting said first member and said second member to form a plurality of electrically and thermally conductive paths between said first member and said second member through said woven mesh screen.

2. A thermal and electrical interface according to claim 1, wherein said non-metallic thermally conductive wetting compound comprises silicone grease.

3. A thermal and electrical interface according to claim 2, wherein said woven mesh screen is comprised of silver wire.

4. A thermal and electrical interface according to claim 2, wherein said woven mesh screen is comprised of copper wire.

5. A thermal and electrical interface according to claim 2, wherein said woven mesh screen is comprised of gold wire.

6. A thermal and electrical interface according to claim 1, wherein said non-metallic thermally conductive wetting compound comprises paraffin.

7. A thermal and electrical interface according to claim 6, wherein said metallic mesh screen is comprised of silver wire.

8. A thermal and electrical interface according to claim 6, wherein said woven mesh screen is comprised of copper wire.

9. A thermal and electrical interface according to claim 6, wherein said woven mesh screen is comprised of gold wire.

10. A thermal and electrical interface according to claim 1, wherein said woven mesh screen is comprised of silver wire.

11. A thermal and electrical interface according to claim 1, wherein said woven mesh screen is comprised of copper wire.

12. A thermal and electrical interface according to claim 1, wherein said woven mesh screen is comprised of gold wire.

13. A thermal and electrical interface according to claim 1, further comprising a protective plating on said metal wires.

14. A thermal and electrical interface for conducting heat and electricity which may be non-destructively assembled and disassembled, comprising:

an integrated circuit;

a heat sink; and a woven mesh screen said woven mesh screen being comprised of metal wires, said metal wires being woven to form interstitial voids between said metal wires, said interstitial voids being filled with a non-metallic thermally conductive wetting compound which is not permanently solid, said woven mesh screen contacting said integrated circuit and said heat sink to form a plurality of electrically and thermally conductive paths between said integrated circuit and said heat sink through said woven mesh screen, said woven mesh screen also being compressed between said integrated circuit and said heat sink by a compressive force which may be removed to disassemble said interface and applied to assemble said interface.

15. A thermal and electrical interface according to claim 14, wherein said non-metallic thermally conductive wetting compound comprises paraffin.

16. A thermal and electrical interface according to claim 14, wherein said non-metallic thermally conductive wetting compound comprises silicone grease.

17. A thermal and electrical interface according to claim 14, wherein said woven mesh screen is comprised of gold wire.

18. A thermal and electrical interface according to claim 14, further comprising a protective plating on said metal wires.

19. A thermal and electrical interface according to claim 14, wherein said woven mesh screen is comprised of silver wire.

20. A thermal and electrical interface according to claim 14, wherein said woven mesh screen is comprised of copper wire.

21. A thermal and electrical interface according to claim 14, wherein said integrated circuit further includes a first surface and said heat sink further includes a second surface, and said woven mesh screen comprises a single layer disposed parallel to said first surface and said second surface.

22. A method of thermally and electrically interfacing an integrated circuit and a heat sink, comprising the step of:

compressing a woven mesh screen between said integrated circuit and said heat sink, said woven mesh screen being comprised of metal wires, said metal wires being woven to form interstitial voids between said metal wires, said interstitial voids being filled with a non-metallic thermally conductive wetting compound which is not permanently solid said woven mesh screen also contacting said integrated circuit and said heat sink to form a plurality of electrically and thermally conductive paths between said integrated circuit and said heat sink through said woven mesh screen.

* * * * *